(12) United States Patent
Baidya et al.

(10) Patent No.: US 9,268,893 B2
(45) Date of Patent: Feb. 23, 2016

(54) PHOTOLITHOGRAPHY MASK SYNTHESIS FOR SPACER PATTERNING

(75) Inventors: Bikram Baidya, Hillsboro, OR (US);
Omkar S. Dandekar, Hillsboro, OR (US); Vivek K. Singh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 28 days.

(21) Appl. No.: 13/977,661

(22) PCT Filed: Dec. 29, 2011

(86) PCT No.: PCT/US2011/067986
§ 371 (c)(1),
(2), (4) Date: Apr. 15, 2014

(87) PCT Pub. No.: WO2013/101133
PCT Pub. Date: Jul. 4, 2013

(65) Prior Publication Data
US 2015/0095859 A1    Apr. 2, 2015

(51) Int. Cl.
*G06F 17/50* (2006.01)
*G03F 1/68* (2012.01)

(52) U.S. Cl.
CPC .............. *G06F 17/5068* (2013.01); *G03F 1/68* (2013.01)

(58) Field of Classification Search
USPC ........................................................ 716/55
See application file for complete search history.

(56) References Cited

U.S. PATENT DOCUMENTS

| | | | |
|---|---|---|---|
| 2002/0045136 A1* | 4/2002 | Fritze et al. | 430/322 |
| 2003/0229879 A1* | 12/2003 | Pierrat | 716/19 |
| 2004/0128642 A1 | 7/2004 | Beaudette | |
| 2010/0153905 A1 | 6/2010 | Maeda | |
| 2010/0229145 A1 | 9/2010 | Sahouria et al. | |
| 2011/0078638 A1* | 3/2011 | Kahng et al. | 716/52 |
| 2011/0113393 A1* | 5/2011 | Sezginer | 716/106 |

FOREIGN PATENT DOCUMENTS

WO    WO 98-41938    9/1998

OTHER PUBLICATIONS

PCT Search Report, PCT/US2011/067986, Intel Corporation, Sep. 27, 2012, 10 pages.

* cited by examiner

*Primary Examiner* — Paul Dinh
*Assistant Examiner* — Bryce Aisaka
(74) *Attorney, Agent, or Firm* — Blakely, Sokoloff, Taylor & Zafman LLP

(57) ABSTRACT

Photolithography mask synthesis is disclosed for spacer patterning masks. In one example, backbone features are extracted from a target layout of a mask design. A connectivity graph is generated based on the target layout in which lines of the backbone features are represented as nodes on the connectivity graph. The nodes are connected based on spacer patterning process limitations and the connections are assigned to sets. A backbone mask layout is then generated based on one of the sets of nodes.

20 Claims, 5 Drawing Sheets

US 9,268,893 B2

PHOTOLITHOGRAPHY MASK SYNTHESIS FOR SPACER PATTERNING

CROSS-REFERENCE TO RELATED APPLICATION

This patent application is a U.S. National Phase Application under 35 U.S.C. §371 of International Application No. PCT/US2011/067986, filed Dec. 29, 2011, entitled "PHOTOLITHOGRAPHY MASK SYNTHESIS FOR SPACER PATTERNING".

FIELD

The present description relates to the field of photolithography mask design and, in particular, to synthesizing masks for a spacer process.

BACKGROUND

Electronic and micromechanical devices are formed by patterning successive layers on a substrate using lithography. The patterns are formed by applying a layer of photoresist to a surface. Light is then passed through a patterned imaging plate, such as a mask or reticle, to expose the photoresist in patterns that correspond to the desired features on the substrate. A developer is applied and the photoresist is etched away leaving only the features in a pattern corresponding to the pattern on the mask. As the size of the features, such as parts of transistors, decreases, there are more features on the same size mask and the mask designs becomes more complex.

The spacer photolithography patterning process uses a combination of photolithography masks in order to achieve a designed layout pattern on a layer of photoresist. Depending on the process choice, two or three masks are synthesized based on the drawn layout data. The three masks are used in sequence to expose a single layer of photoresist and are typically a backbone mask, a trim mask, and an optional add mask. The add mask is the simplest to synthesize since it contains areas that are larger than the lithographically challenging regions. The primary function of the add mask is normally to add any large features that cannot be synthesized using the backbone and the trim masks alone.

The backbone mask is the most difficult to synthesize because of the nature of the spacer process that is used in the spacer patterning process. In the spacer process each edge of the backbone mask leads to a structure on the wafer that will either contribute to the design or will be removed using the trim mask. In addition, the mask is still harder to design because it must also be manufacturable. As a result, it is not always obvious how to synthesize the design of a backbone mask that has any shape other than a repetitive grating pattern. One such example is shown in the example below.

The design space for the backbone masks is often restricted to simple one dimensional grating structures with strict limits on pitch variations. In other words, the distance between the lines of the grating is not allowed to significantly vary. Such restrictive design rules simplify the synthesis requirement at the cost of a loss in design flexibility. Simplifying all the shapes to a grating pattern is an extremely restrictive design rule that limits the possibilities of the spacer process.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

The synthesis of backbone, trim and add masks for a spacer patterning process is described for full chip layouts. In one embodiment of the invention a connectivity graph, derived from the design geometry is used to create a canonical set of backbone masks. Neighbor-based geometric simplification may then be used to synthesize the trim mask to make it more manufacturable. In one embodiment, connectivity in the design geometry is identified using graph-based proximity constraints. These constraints are often derived from the lithographic constraints of the underlying space process. Complementary backbones from the connectivity graph may be identified for any random layout using graph coloring theory principles.

A simplified description of a technique to solve the inverse problem for random layouts according to an embodiment of the invention is as follows: The spacer process characteristic is captured along with geometric information in the layout data. This is used to develop a constraint graph. Complementary backbone layouts are detected from the constraint graph using graph coloring. One of the backbone layouts is selected and the trim mask is then derived based on the backbone layout. The add mask can then be derived by comparing differences from the layout data. The trim and the add masks can then be simplified based on geometric and process information.

Figure 1A:
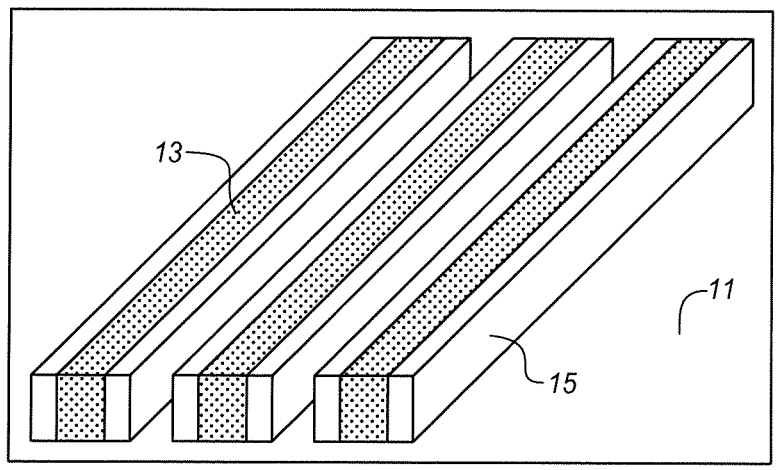
FIG. 1A is diagram of a spacer patterning using a backbone and spacer growth according to an embodiment of the invention.

Referring to FIG. 1A, a spacer photolithography process is diagrammed. FIG. 1A shows a substrate upon which a spacer backbone 13 has been produced by photolithography. The backbone is made from photoresist and in this example is in the common form a grid of parallel lines. A spacer 15 is grown on all exposed sides of the backbone using a deposition process. There are accordingly, in this example, two parallel lines of photoresist for each spacer. The backbone is then removed leaving only the grid of spacers 15 as shown in FIG. 1B.

Figure 1B:
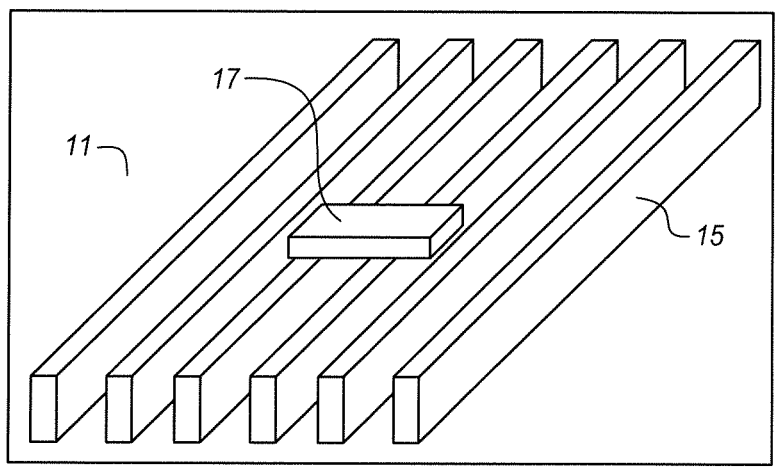
FIG. 1B is diagram of a spacer patterning using a trim feature according to an embodiment of the invention.
Figure 1C:
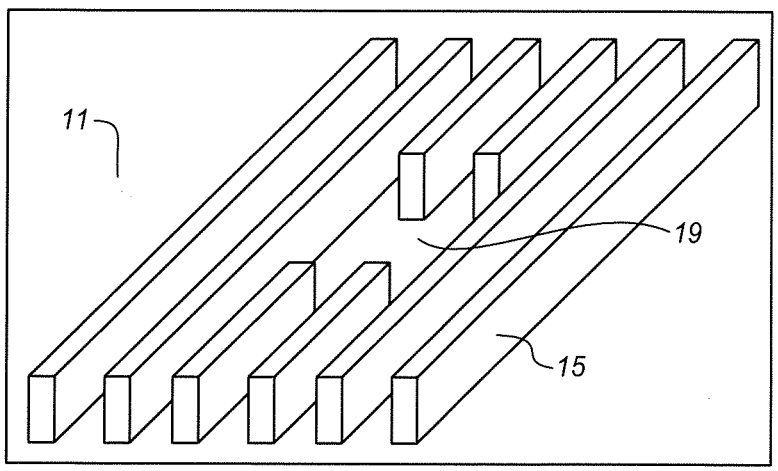
FIG. 1C is diagram of a spacer patterning using trim removal according to an embodiment of the invention.

A trim pattern 17 is then deposited on the backbone pattern as shown in FIG. 1B. When the trim is removed, a final pattern is produced as shown in FIG. 1C. The final pattern has the grid of spacers with a cavity 19 where the grid was trimmed. These patterns are produced using exposure, development, and removal processes that may be designed to suit the particular substrate material and photolithography chemistry and materials. The final output pattern may then be supplemented using as Add mask to form additional features that relate to the illustrated pattern. In some cases, only a backbone and add masks may be used, while in other cases only the backbone and trim mask may be used. The particular number of masks and choice of masks will depend on the particular target design and the capabilities of the process being used.

Figure 2:
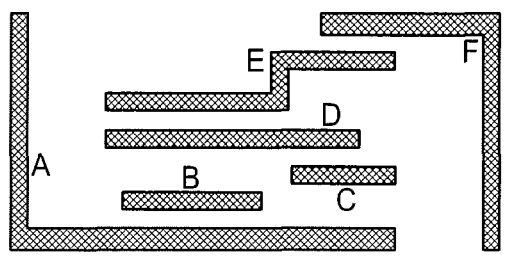
FIG. 2 is diagram of a portion mask design suitable for application of an embodiment of the invention.

FIG. 2 is a diagram of a theoretical input layout. This layout corresponds to a single layer of patterning and is greatly simplified for illustration purposes. Typically a complete layout will have thousands or millions of devices, although the invention is not so limited. In addition, the example layout is primarily composed of horizontal and vertical lines. Such a design is easier to apply to the spacer process, however the layout may have other shapes depending upon the particular device to be produced and the process limitations. Each feature in the design is labeled A through F and has either a horizontal aspect, a vertical aspect or both.

Starting with the input layout, the first operation may be to identify areas that will be generated by the add mask. These can be identified as the areas that do not follow the spacer process restrictions. These areas can be identified in a variety of different ways. One simple technique is to use Boolean grow-shrink operations. This may be done by comparing the spacer width achieved by the process to the target features. Any additional width or other aspects can be added by the add mask. In the simple example target layout of FIG. 2, there are no such areas, so the rest of the description below focuses on the remaining two masks, backbone and trim.

Figure 3:
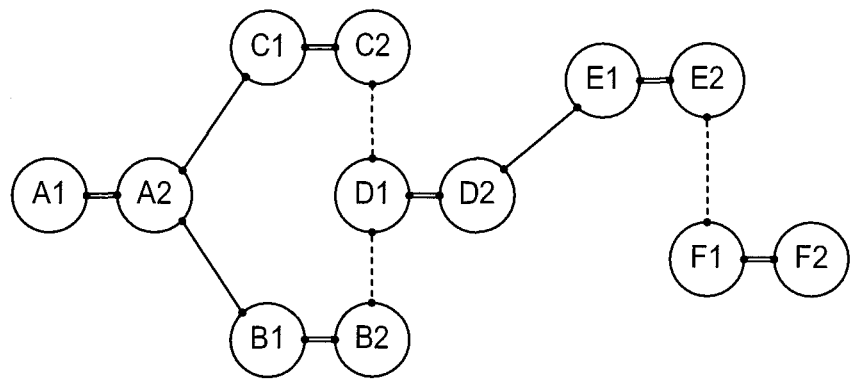
FIG. 3 is a connectivity diagram of nodes of the mask design of FIG. 2 according to an embodiment of the invention.

The backbone may be extracted using the geometric properties of the target layout to generate a connectivity graph as shown in FIG. 3. The connectivity graph captures local constraints coming from the characteristics of the spacer fabrication process. Accordingly the connectivity may be modified to suit different processes.

A backbone extraction algorithm according to an embodiment of the present invention uses a graph representation of the input layout. Each critical edge of the input layout is represented as a node. Referring to FIG. 1A, each backbone ridge 13 has two sides and an edge 15 is grown on each side. The edges represented by a node correspond to the edges that are formed by spacer growth in the spacer process. These nodes are then connected to each other as shown by the dotted lines on the graph.

The two edges on either side of a spacer or backbone are represented by the same letter. A1 and A2 are two edges that may correspond to a single spacer. Either one may be used to construct feature A of the target layout. Note that in this case the feature A has a vertical section and a horizontal section. The backbone mask may produce this by printing a backbone feature with a vertical section and a horizontal section. The backbone mask encompassing edge A1 or edge A2 can be used to fabricate the desired single feature A of the target layout.

In the graph of FIG. 3, all the edges are connected to the edge on the opposite side of the backbone by a double line. In addition, nearby feature are connected either by a solid line or a dotted line. Non-essential edges, such as line ends, that are not determined by the spacer growth but from a trim layer are not represented in the graph. The edges are distinguished into space edge and filled edge. Filled edges refer to the edges represented by the double lines and connect the nodes corresponding to two edges of the backbone. Space edges refer to the edges that connect across space in the target layout.

A modified graph algorithm is then used to divide the space edges into two sets such that when a node is selected, all nodes adjacent to it (neighbor nodes) are connected by the a single set of color space edges and all nodes connected to the neighbor nodes are connected to a different set of color space edges. In the illustrated example a first color space is represented by dotted lines connecting nearby nodes and a second color space is represented by solid lines connecting nearby nodes.

When evaluating neighbor nodes, two nodes connected by a filled edge are considered a single unit, e.g. C1 and C2, or A1 and A2 form a single unit. So D1 might connect to either C1 or C2. However, if C1 is connected to A, by connecting to A2 as shown, then C1 cannot also connect to D. Accordingly C2 is connected to D, by connecting to D1. If this coloring cannot be achieved then the target layout may not be compatible with the spacer process and must be printed using some other technique. After all the connections are drawn, the two space edge color sets (solid and dashed line connectors) map to two canonical backbones, one for each color space. The spacer process because it produces two edges on each spacer creates two possible backbone masks.

Figure 4A:
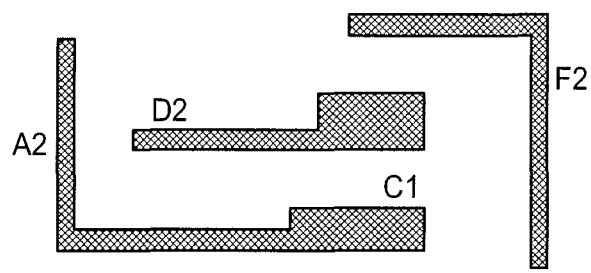
FIG. 4A is a diagram of one of the two canonical backbone designs from the connectivity diagram according to an embodiment of the invention.
Figure 4B:
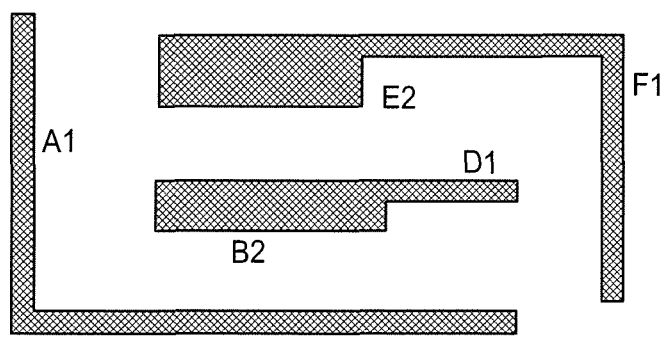
FIG. 4B is a diagram of the other of the two canonical backbone designs from the connectivity diagram according to an embodiment of the invention.

Diagrams of the two masks are shown as FIGS. 4A and 4B. FIG. 4A corresponds to the solid line color space. Accordingly, it includes A2, C1, B1, D2, E1 and F2. FIG. 4B is composed of the dotted line color space. It has A1, C2, D1, B2, E2, and F1. In the diagrams, 1 refers to the upper and right sides, while 2 refers to the lower and left sides. This can be seen for example by comparing F of FIG. 2 with the corresponding feature of FIGS. 4A and 4B. In FIG. 4A, F2 is used and appears lower and to the left. In FIG. 4B, F1 is used and appears higher and to the right.

Figure 5A:
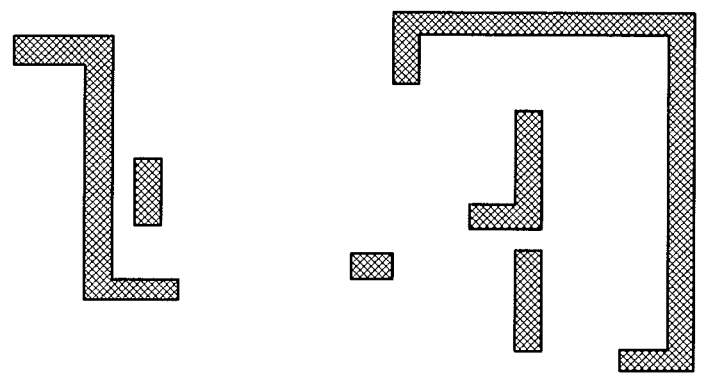
FIG. 5A is a diagram of a trim mask based on the backbone design of FIG. 4A according to an embodiment of the invention.

Having determined the two backbones masks, one or the other is selected for use in the process. The selected backbone mask is then used to predict the trim mask. The trim mask may be determined by simple Boolean operations that emulate the spacer process. As an example, the first backbone mask is chosen corresponding to FIG. 4A. The first mask may be chosen because it is easier to manufacture or for reasons related to other aspects of the process, such as the resulting trim mask. FIG. 5A shows a trim mask that may be used to apply to spacers produced by the canonical backbones of the mask of FIG. 4A, to produce the target layout.

Figure 5B:
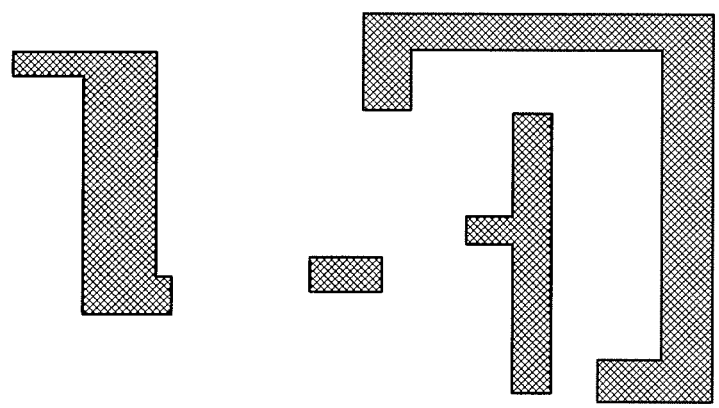
FIG. 5B is a diagram of the trim mask of FIG. 5A after modification for manufacturability according to an embodiment of the invention.

Finally proximity based polygon grouping and jog filling techniques may be used to enforce manufacturability constraints on the trim mask. This transforms the synthesized mask of FIG. 5A to a simplified trim mask as shown in FIG. 5B. The techniques described above allow spacer technology to be used for many different target layouts including many that do not correspond to a grid with even spacing.

Figure 6:
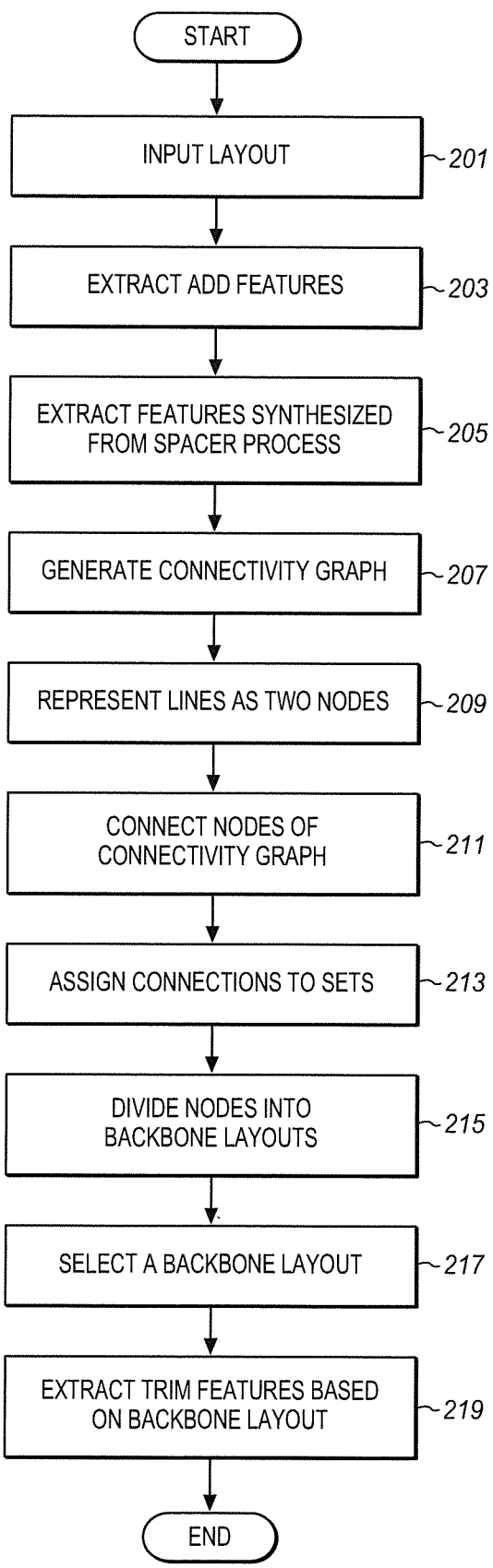
FIG. 6 is a process flow diagram of synthesizing spacer patterning masks according to an embodiment of the invention.

FIG. 6 presents the process described above as a flow diagram. The process starts with a target design or input layout. Then the Add Mask features, if any are extracted at 203. At 205, the features to be synthesized using a spacer processes are extracted. The geometric properties of the target layout are used to generate a connectivity graph that includes local spacer process constraints at 207.

At 209, each design line is represented by two nodes (e.g. E1-E2) in the graph. These nodes refer to the two faces of the design line. At 211, lithographic constraints (derived from any of a variety of different process characteristics such as spacer growth, desired features, spaces between features, feature sizes, etc.) are applied to determine which faces are related and their relationship type. The relationship may be either of two types: compatible and incompatible. In the example above, F1-F2 are not compatible with each other because they are edges of the same design line. F1-E2 are compatible with each other, so are A2-B1, because they correspond to neighboring features. A2 and F1 have no direct relationship between them. However, they are indirectly incompatible because of the many features in between them.

At 213, connections are assigned to one of two sets, such as color groups above. Compatible faces or nodes are assigned to the same set. After a face is selected for a set, then a face that is not compatible with this face cannot be chosen to belong to the same set. Nodes with no relationship can belong to the same set, as long as compatibility between their neighbors can be satisfied. Since the set assignment information is not available at this time, the relation-type is simply encoded in the graph edges. Non-critical edges, such as line-ends, may be ignored during this analysis so that they do not form a node in the graph.

At 215, the faces are divided into two sets (a canonical backbone pair), such that all compatible nodes are assigned to the same set. This provides two potential backbone layouts that may be used to produce the first step of the input layout. If the nodes cannot all be partitioned into two sets, then the input layout may not be suitable for manufacturing using the spacer process. These two sets of nodes are then used to form the canonical backbone layouts.

One of the two backbone layouts is then selected at 217 based on manufacturablity or suitability for the lithography process. At 219, based on the selected backbone layout, the trim mask features are extracted from the input layout. At this point the process may end with the design for both or all three masks determined. To apply the masks to a useful purpose, the masks, backbone, trim, and add, are fabricated, mounted in reticles and used to produce a pattern on a substrate using photolithography.

Figure 7:
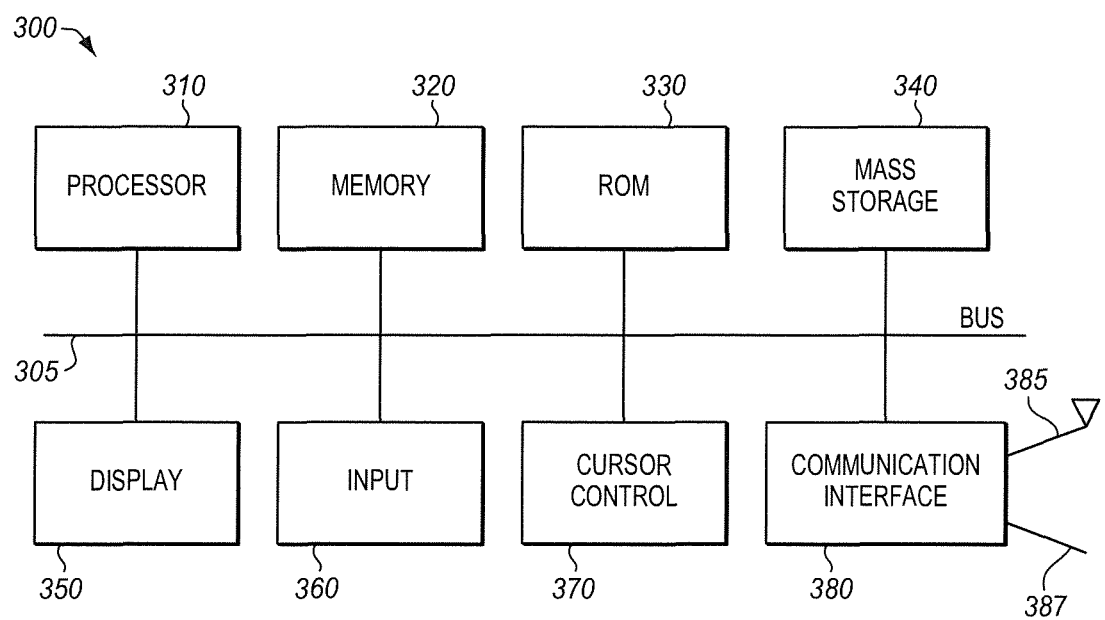
FIG. 7 is a block diagram of a computing system suitable for implementing embodiments of the invention.

FIG. 7 is a block diagram of one embodiment of an electronic system that may be used to implement the process flow diagram of FIG. 6. Alternative systems may include more, fewer, or different components. Systems such as that illustrated may be coupled together to provide multiple computing nodes.

Electronic system 300 includes a bus 305 or other communications device to communicate information, and a processor 310 coupled to the bus 305 to process information. While the electronic system 300 is illustrated with a single processor, the electronic system 300 may include multiple processors or co-processors. The electronic system 300 further includes a random access memory (RAM) or other dynamic storage device 320 (referred to as memory), coupled to the bus 305 to store information and instructions to be executed by the processor 310. The memory 320 also may be used to store temporary variables or other intermediate information during execution of instructions by the processor 310.

The electronic system 300 also includes a read only memory (ROM) and/or other static storage device 330 coupled to bus 305 to store static information and instructions for the processor 310. A data storage device 340 is coupled to the bus 305 to store information and instructions.

The electronic system 300 may also be coupled via the bus 305 to a display device 350, such as a light emitting diode (LED) or liquid crystal display (LCD), to display information to a user. An input device 360, including alphanumeric and other keys, is typically coupled to the bus 305 to communicate information and command selections to the processor 310. Another type of user input device is a cursor control 370, such as a mouse, a trackball, or cursor direction keys to communicate direction information and command selections to the processor 310 and to control cursor movement on a display 350. The electronic system 300 further includes a network interface 380, such as a wired network interface 387 or a wireless network interface 385 to provide access to a network, such as a local area network.

Instructions are provided to memory from a storage device, such as magnetic disk, a read-only memory (ROM) integrated circuit, CD-ROM, DVD, via a remote connection (e.g., over a wired or wireless network via the network interface) providing access to one or more electronically-accessible media, etc. In alternative embodiments, hard-wired circuitry may be used in place of or in combination with software instructions. Thus, execution of sequences of instructions is not limited to any specific combination of hardware circuitry and software instructions.

A computer-readable medium includes any mechanism that provides (i.e., stores and/or transmits) content (e.g., computer executable instructions) in a form readable by an electronic device (e.g., a computer, a personal digital assistant, a cellular telephone). For example, a computer-readable medium may include read only memory (ROM); random access memory (RAM); magnetic disk storage media; optical storage media; or flash memory devices, etc.

Methods and apparatuses are described herein with respect to integrated circuit manufacturing; however, the techniques described may be applied to the manufacturing and/or design process of any integrated device. Integrated devices include integrated circuits, micromachines, thin film structures such as disk drive heads, gene chips, micro-electromechanical systems (MEMS), or any other article of manufacture that is manufactured using lithography techniques.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

The above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method comprising:
   identifying areas of a target layout of a mask design that will be generated using an add mask, the target layout being for a spacer photolithography patterning process for patterning a semiconductor device;
   extracting add features from the target layout using the identified areas;
   extracting backbone features from the target layout after extracting the add features, the backbone features corresponding to photoresist in a grid of parallel lines between deposited spacers and excluding the identified add features;
   generating a connectivity graph based on the target layout, the connectivity graph capturing local constraints from the spacer photolithography patterning process;
   representing lines of the backbone features as nodes on the connectivity graph, the nodes corresponding to edges that are formed by spacer growth in the spacer photolithography patterning process;

connecting nodes of the connectivity graph based on spacer patterning process limitations;

assigning connections to sets so that nodes that are not compatible are assigned to different sets;

generating a backbone mask layout based on one of the sets of nodes; and synthesizing a photolithography mask for patterning a layer of photoresist on the semiconductor device using the generated backbone mask layout.

2. The method of claim 1, further comprising:

extracting trim features from the target layout using the backbone mask layout; and generating a trim mask based on the trim features.

3. The method of claim 2, further comprising simplifying the trim mask to improve manufacturability.

4. The method of claim 2, wherein extracting add features comprises applying a Boolean grow-shrink operation to the features of the target layout in comparison to the spacer patterning process.

5. The method of claim 1, further comprising generating an add mask based on the extracted add features.

6. The method of claim 1, wherein assigning connections to sets comprises assigning connection to one of two sets.

7. The method of claim 1, wherein connecting nodes comprises using geometric properties of the target layout to connect nodes with connections that capture local constraints of the spacer patterning process.

8. The method of claim 1, wherein connecting nodes comprises connecting nodes based on proximity in the target layout.

9. The method of claim 1, wherein representing lines comprises representing each critical edge of the target layout as a node.

10. The method of claim 1, wherein representing nodes comprises representing each line of the backbone features as two nodes, the two nodes representing two opposing sides of a spacer in the spacer patterning process.

11. The method of claim 10, wherein connecting nodes comprises connecting one of the two nodes of a line to a third node of another feature and not connecting the other of the two nodes of the line to the same other node.

12. The method of claim 10, wherein assigning connections to sets comprises assigning each connection to one of two sets, the two sets being based on the two nodes of each line, wherein generating a backbone mask layout comprises deriving two canonical backbone masks, one for each of the two sets and selecting one of the two backbone masks.

13. The method of claim 12, wherein selecting one of the two backbone masks comprises selecting one of the two backbone masks based on manufacturability.

14. A computer-readable medium having instructions thereon that, when operated on by the computer, cause the computer to perform operations comprising:

identifying areas of a target layout of a mask design that will be generated using an add mask, the target layout being for a spacer photolithography patterning process for patterning a semiconductor device;

extracting add features from the target layout using the identified areas;

extracting backbone features from the target layout after extracting the add features, the backbone features corresponding to photoresist in a grid of parallel lines between deposited spacers and excluding the identified add features;

generating a connectivity graph based on the target layout, the connectivity graph capturing local constraints from the spacer photolithography patterning process;

representing lines of the backbone features as nodes on the connectivity graph, the nodes corresponding to edges that are formed by spacer growth in the spacer photolithography patterning process;

connecting nodes of the connectivity graph based on spacer patterning process limitations;

assigning connections to sets so that nodes that are not compatible are assigned to different sets;

generating a backbone mask layout based on one of the sets of nodes; and synthesizing a photolithography mask for patterning a layer of photoresist on the semiconductor device using the generated backbone mask layout.

15. The medium of claim 14, the operations further comprising:

extracting trim features from the target layout using the backbone mask layout; and generating a trim mask based on the trim features.

16. The medium of claim 14, wherein connecting nodes comprises using geometric properties of the target layout to connect nodes with connections that capture local constraints of the spacer patterning process.

17. The medium of claim 1, wherein representing lines comprises representing each critical edge of the target layout as a node.

18. An apparatus comprising a set of photolithography masks including a backbone mask for spacer patterning generated by:

identifying areas of a target layout of a mask design that will be generated using an add mask, the target layout being for a spacer photolithography patterning process for patterning a semiconductor device;

extracting add features from the target layout using the identified areas;

extracting backbone features from the target layout after extracting the add features, the backbone features corresponding to photoresist in a grid of parallel lines between deposited spacers and excluding the identified add features;

generating a connectivity graph based on the target layout, the connectivity graph capturing local constraints from the spacer photolithography patterning process;

representing lines of the backbone features as nodes on the connectivity graph, the nodes corresponding to edges that are formed by spacer growth in the spacer photolithography patterning process;

connecting nodes of the connectivity graph based on spacer patterning process limitations;

assigning connections to sets so that nodes that are not compatible are assigned to different sets; and generating a backbone mask layout based on one of the sets of nodes.

19. The apparatus of claim 18, further comprising a trim mask generated by:

extracting trim features from the target layout using the backbone mask layout; and generating a trim mask based on the trim features.

20. The apparatus of claim 18, further comprising an add mask generated by generating an add mask based on the add features.

* * * * *